United States Patent
Asano et al.

(10) Patent No.: US 8,611,154 B2
(45) Date of Patent: Dec. 17, 2013

(54) SEMICONDUCTOR DEVICE

(75) Inventors: Shigehiro Asano, Kanagawa (JP); Shinichi Kanno, Tokyo (JP); Junji Yano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 12/866,668

(22) PCT Filed: Sep. 22, 2008

(86) PCT No.: PCT/JP2008/067602
§ 371 (c)(1),
(2), (4) Date: Aug. 6, 2010

(87) PCT Pub. No.: WO2009/147753
PCT Pub. Date: Dec. 10, 2009

(65) Prior Publication Data
US 2011/0016266 A1    Jan. 20, 2011

(30) Foreign Application Priority Data

Jun. 4, 2008    (JP) .................................. 2008-147212

(51) Int. Cl.
*G11C 11/34*    (2006.01)
(52) U.S. Cl.
USPC .................................................... 365/185.17
(58) Field of Classification Search
USPC .................................................... 365/185.17
See application file for complete search history.

(56) References Cited

U.S. PATENT DOCUMENTS

| | | | |
|---|---|---|---|
| 6,180,426 B1 | 1/2001 | Lin | |
| 6,303,996 B2 | 10/2001 | Lin | |
| 7,006,377 B2 * | 2/2006 | Oh | 365/185.04 |
| 7,164,565 B2 * | 1/2007 | Takeda | 361/56 |
| 8,116,057 B2 * | 2/2012 | Whitby-Strevens | 361/119 |
| 2005/0116331 A1 * | 6/2005 | Tsunozaki | 257/686 |
| 2010/0223531 A1 | 9/2010 | Fukutomi et al. | |

FOREIGN PATENT DOCUMENTS

| | | |
|---|---|---|
| JP | 7 302176 | 11/1995 |
| JP | 10 79438 | 3/1998 |
| JP | 2002 55822 | 2/2002 |
| JP | 2002 353396 | 12/2002 |
| JP | 2007 66922 | 3/2007 |

OTHER PUBLICATIONS

Office Action issued Dec. 24, 2012 in Taiwanese Application No. 097145190 (w/English language translation).

* cited by examiner

*Primary Examiner* — Huan Hoang
*Assistant Examiner* — Pablo Huerta
(74) *Attorney, Agent, or Firm* — Oblon, Spivak, McClelland, Maier & Neustadt, L.L.P.

(57) ABSTRACT

On a single semiconductor package PK1, m semiconductor chips CP1 to CPm are mounted, and the semiconductor package PK1 has external terminals T shared by m pad electrodes PD1 to PDm of the m semiconductor chips CP1 to CPm. An electrostatic protection circuit CD is mounted on only one CPm of the m semiconductor chips CP1 to CPm.

18 Claims, 10 Drawing Sheets

SEMICONDUCTOR DEVICE

TECHNICAL FIELD

The present invention relates to a semiconductor device, and is preferably applied to a electrostatic protection system of a semiconductor device including a plurality of stacked semiconductor chips.

BACKGROUND ART

To prevent electrostatic breakdown due to static electricity in an internal circuit, some semiconductor chips incorporating an internal circuit include an electrostatic protection circuit on a pad electrode thereof. In general, such an electrostatic protection circuit is constituted by a large diode because the circuit is required to be resistant to high current generated due to the discharge of the static electricity. Attributed to the diode, large capacitors are added in parallel to the pad electrode of the semiconductor chip, causing a reduction in operating frequency of the internal circuit formed on the semiconductor chip and an increase in electric power consumption.

As an alternative external storage device of a hard disk, a solid state drive has attracted attention (Patent Document 1). Because a solid state drive employs a NAND flash memory as a nonvolatile storage medium for reading and writing data, a mechanical structure such as a hard disk is not required. This brings advantages as achieving a reduction in size and weight, low power consumption, excellent impact resistance, and short access time.

To enable a solid state drive to have an increased data capacitance, there has been a method of stacking on a single semiconductor package a plurality of semiconductor chips incorporating NAND flash memories. In stacking a plurality of semiconductor chips on a single semiconductor package, data lines and address lines of NAND flash memories are not drawn from each semiconductor chip individually on the semiconductor package. Instead, each set of the data lines and of the address lines shares one external terminal among the semiconductor chips, for the purpose of reducing the number of external terminals of the semiconductor package.

In a conventional solid state drive, however, an electrostatic protection circuit is mounted on each semiconductor chip. Thus, when one external terminal is shared among a plurality of semiconductor chips, electrostatic protection circuits as many as the semiconductor chips are connected in parallel to the external terminal. Because only one electrostatic protection circuit adds a large capacitance to the semiconductor chip, much larger capacitances are added to the external terminal in parallel. This causes a further reduction in operating frequency of the internal circuit formed on the semiconductor chip, and a further increase in electric power consumption.

[Patent Document 1] Japanese Patent Application Laid-open No. 7-302176

An object of the present invention is to provide a semiconductor device capable of reducing the capacitance to be added to external terminals, without degrading the electrostatic protection function of a plurality of semiconductor chips sharing the external terminals.

DISCLOSURE OF INVENTION

To solve the above-described problems, according to an aspect of the present invention, there are provided: a plurality of semiconductor chips including internal circuits respectively formed thereon; a semiconductor package on which the semiconductor chips are mounted, and which has external terminals shared by pad electrodes of the semiconductor chips; and an electrostatic protection circuit that is formed on a part of the semiconductor chips, and that protects the internal circuits from static electricity.

According to another aspect of the present invention, there are provided: first and second semiconductor chips including internal circuits respectively formed thereon; electrostatic protection circuits that are respectively formed on the first and the second semiconductor chips, and that protect the internal circuits from static electricity; first pad electrodes respectively formed on the first and the second semiconductor chips, and connected to the internal circuits via the electrostatic protection circuits; second pad electrodes respectively formed on the first and the second semiconductor chips, and connected to the internal circuits, not via the electrostatic protection circuits; and a semiconductor package on which the first and the second semiconductor chips are mounted, and which has external terminals shared by the first pad electrode of the first semiconductor chip and by the second pad electrode of the second semiconductor chip.

BEST MODE(S) FOR CARRYING OUT THE INVENTION

Exemplary embodiments of a semiconductor device according to the present invention are described with reference to the accompanying drawings. The present invention is not limited by the embodiments.

First Embodiment

Figure 1:
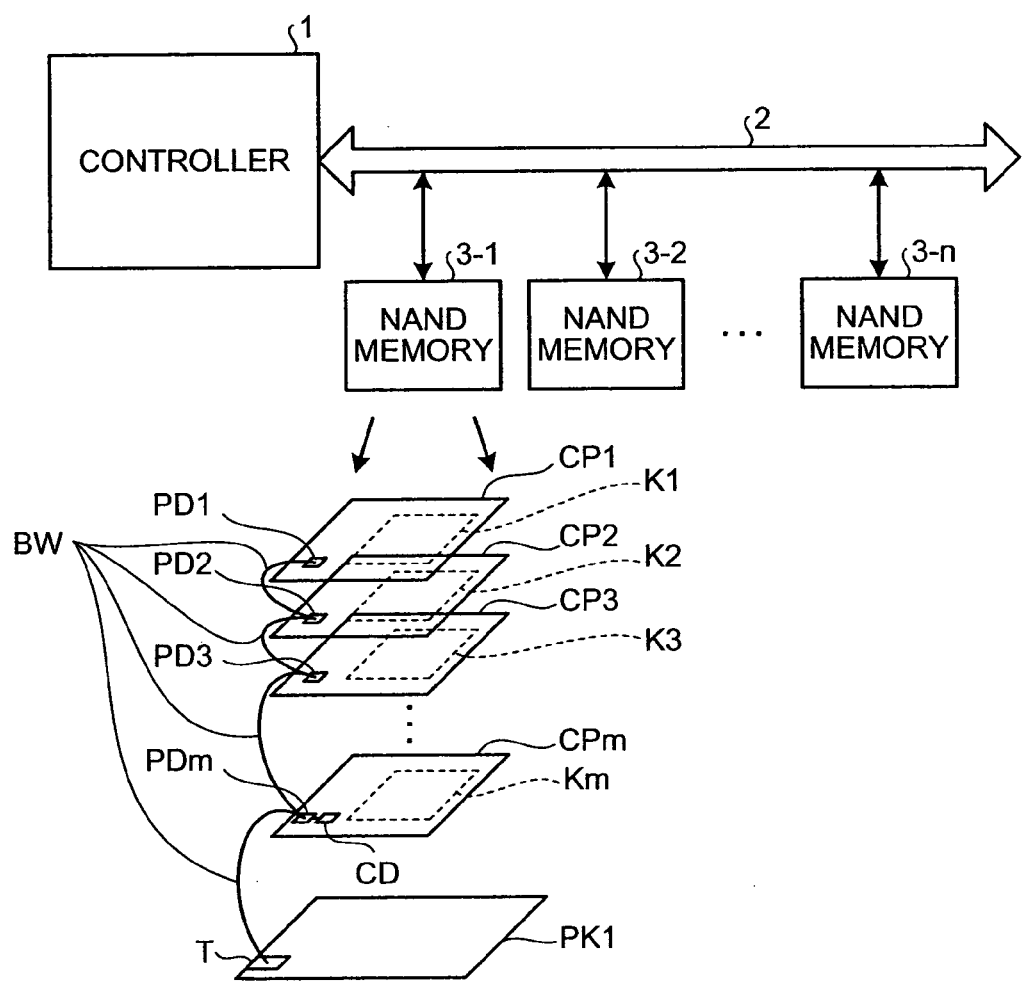
FIG. 1 is a schematic block diagram of a solid state drive to which a semiconductor device according to a first embodiment of the present invention is applied.

FIG. 1 is a schematic block diagram of a solid state drive to which a semiconductor device according to a first embodiment of the present invention is applied.

In FIG. 1, the solid state drive includes n NAND memories 3-1 to 3-$n$ (n is an integer equal to or greater than 2), and a controller 1 that controls to drive the NAND memories 3-1 to 3-$n$. The NAND memories 3-1 to 3-$n$ are connected in parallel to the controller 1 via a bus 2. For example, the NAND memory 3-1 includes m semiconductor chips CP1 to CPm (m is an integer equal to or greater than 2). On the semiconductor chips CP1 to CPm, internal circuits K1 to Km are respectively mounted, and pad electrodes PD1 to PDm connected to the internal circuits K1 to Km are formed, respectively. In each of the internal circuits K1 to Km, for example, a semiconductor memory element such as a NAND flash memory can be provided, and such a NAND flash memory may include a unit cell array, a decoder, a sense amplifier, a charge pump circuit, and a page buffer.

The m semiconductor chips CP1 to CPm are mounted on a single semiconductor package PK1, and the semiconductor package PK1 has an external terminal T shared by the pad electrodes PD1 to PDm on the m semiconductor chips CP1 to CPm. As a method of mounting the semiconductor chips CP1 to CPm on the semiconductor package PK1, the semiconductor chips CP1 to CPm may be stacked, or the semiconductor chips CP1 to CPm may be arranged in the same plane. The semiconductor chips CP1 to CPm may be mounted by face-down mounting or face-up mounting. As a method of allowing the m pad electrodes PD1 to PDm to share the single external terminal T, the m pad electrodes PD1 to PDm can be connected to the single external terminal T by bonding wires BW. Alternatively, by flip-mounting the semiconductor chips CP1 to CPm, the pad electrodes PD1 to PDm and the external terminal T may be connected to one another via bump electrodes formed on the pad electrodes PD1 to PDm. Alternatively, by forming a penetrating electrode in the semiconductor chips CP1 to CPm, the pad electrodes PD1 to PDm and the external terminal T may be connected to one another via the penetrating electrode.

Among the m semiconductor chips CP1 to CPm, an electrostatic protection circuit CD is mounted only on the semiconductor chip CPm. The pad electrode PDm on the semiconductor chip CPm is connected to the internal circuit Km via the electrostatic protection circuit CD. On the other hand, as to (m−1) number of the semiconductor chips CP1 to CPm−1 other than the semiconductor chip CPm, the pad electrodes PD1 to PDm−1 are respectively connected to the internal circuits K1 to Km−1 via no electrostatic protection circuit. This prevents that the capacitance of the m electrostatic protection circuits is added to the external terminal T, even when the single external terminal T is shared by the m pad electrodes PD1 to PDm. The same applies to the NAND memories 3-2 to 3-$n$ other than the NAND memory 3-1.

As to (m−1) number of the semiconductor chips CP1 to CPm−1 other than the semiconductor chip CPm, the pad electrodes PD1 to PDm−1 of the semiconductor chips CP1 to CPm−1 can be connected via the bonding wires BW and the pad electrode PDm. This arrangement enables sharing of the electrostatic protection circuit CD on the semiconductor chip CPm, even when no electrostatic protection circuit CD is mounted on the semiconductor chips CP1 to CPm−1. Thus, it becomes possible to reduce the capacitance to be added to the external terminal T, without degrading the electrostatic protection function of the m semiconductor chips CP1 to CPm that share the external terminal T. This prevents a reduction in operating frequency of the internal circuits K1 to Km respectively formed on the semiconductor chips CP1 to CPm, and an increase in electric power consumption.

The above embodiment describes a method of mounting the electrostatic protection circuit CD only on one semiconductor chip CPm among the m semiconductor chips CP1 to CPm. Among the m semiconductor chips CP1 to CPm, not greater than (m−1) number of the semiconductor chips may incorporate an electrostatic protection circuit.

The above embodiment describes the NAND memories 3-1 to 3-$n$, as an example of a semiconductor device on which an electrostatic protection circuit is to be mounted. The semiconductor device may be a nonvolatile semiconductor memory such as a NOR memory, or a volatile semiconductor memory such as a dynamic random access memory (DRAM) or a static random access memory (SRAM). Examples of such a semiconductor device on which an electrostatic protection circuit is to be mounted may include a processor, a logic circuit, a solid-state image sensor, and a light emitting element such as a light emitting diode or a laser diode, as well as the semiconductor memory.

Figure 2:
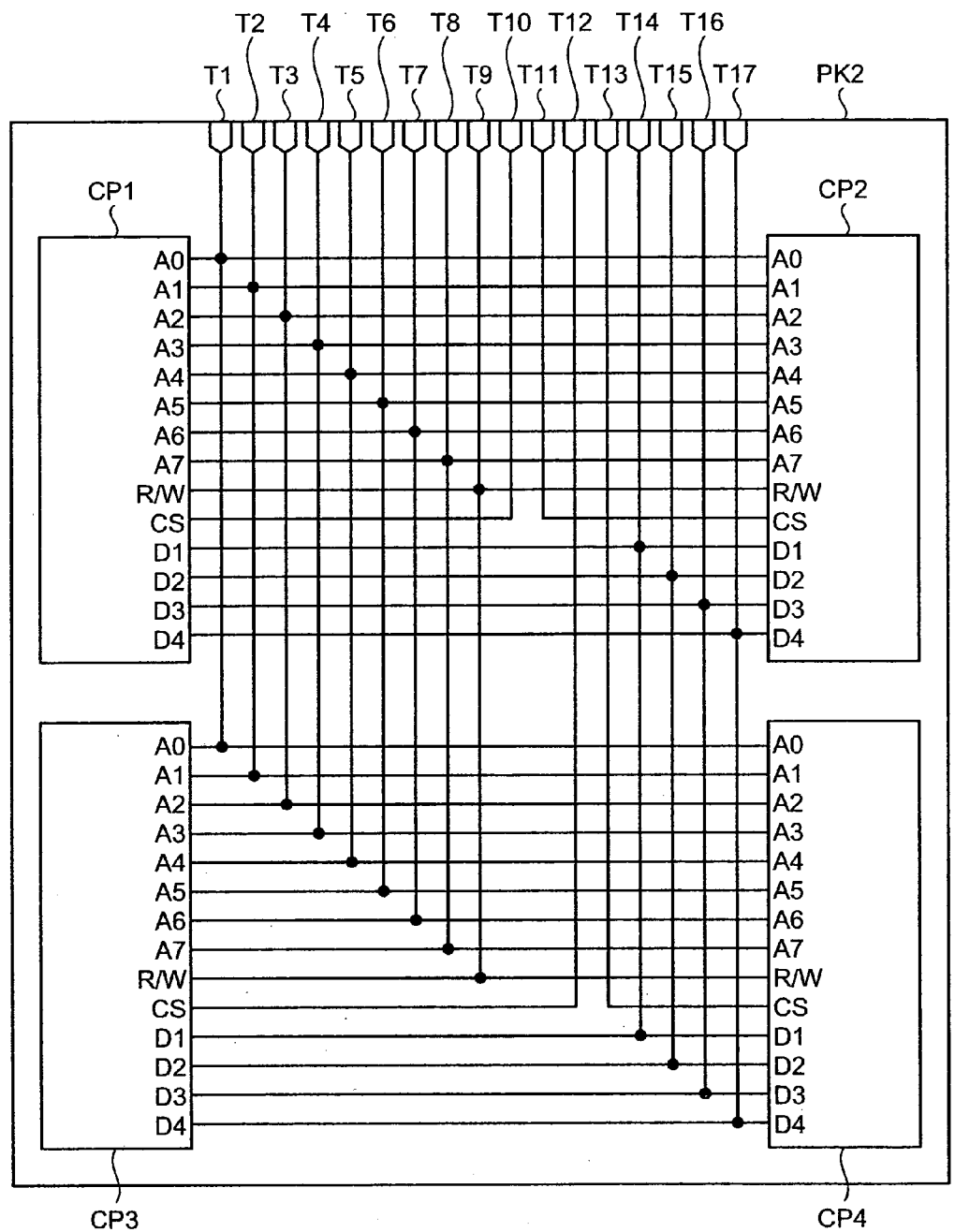
FIG. 2 is a schematic block diagram of the semiconductor device according to the first embodiment.

FIG. 2 is a schematic block diagram of the semiconductor device according to the first embodiment of the present invention. In the following embodiment, the number of the semiconductor chips CP1 to CPm shown in FIG. 1 is four as an example.

In FIG. 2, semiconductor chips CP1 to CP4 each include, for example, eight address terminals A0 to A7, one read/write terminal R/W, one chip select terminal CS, and four data terminals D1 to D4. A semiconductor package PK2 includes 17 external terminals T1 to T17.

On the semiconductor package PK2, the four semiconductor chips CP1 to CP4 are mounted, and the address terminals A0 to A7 of the four semiconductor chips CP1 to CP4 are respectively connected to the external terminals T1 to T8. The read/write terminal R/W of each of the four semiconductor chips CP1 to CP4 is connected to the external terminal T9. The chip select terminal CS of the semiconductor chip CP1 is connected to the external terminal T10, the chip select terminal CS of the semiconductor chip CP2 is connected to the external terminal T11, the chip select terminal CS of the semiconductor chip CP3 is connected to the external terminal T12, and the chip select terminal CS of the semiconductor chip CP4 is connected to the external terminal T13. The data terminals D1 to D4 of the four semiconductor chips CP1 to CP4 are respectively connected to the external terminals T14 to T17.

To each of the address terminals A0 to A7, the read/write terminals R/W, the chip select terminals CS, and the data terminals D1 to D4, an electrostatic protection circuit may be mounted, for example, on the semiconductor chip CP1 among the semiconductor chips CP1 to CP4.

Figure 3:
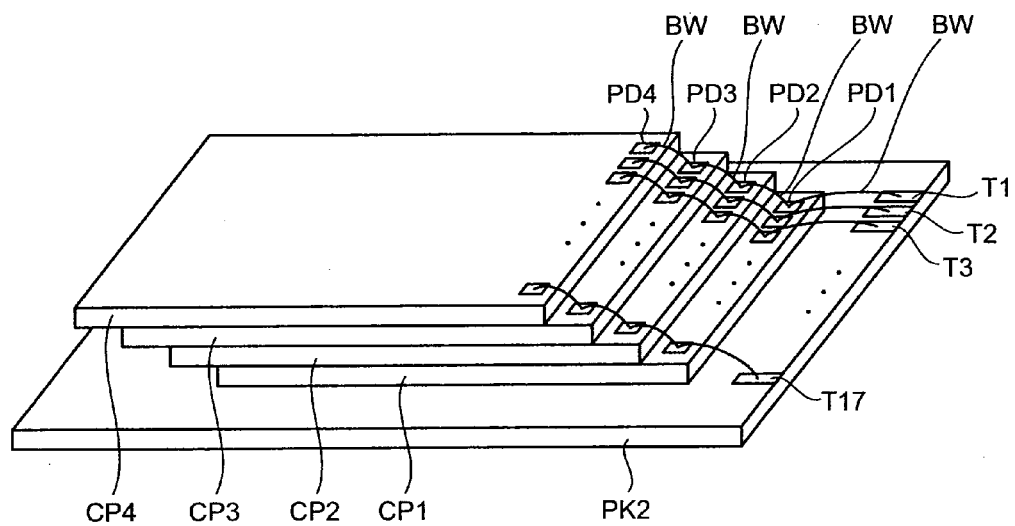
FIG. 3 is a schematic perspective view of the semiconductor device shown in FIG. 2.

FIG. 3 is a perspective schematic view of the semiconductor device shown in FIG. 2.

In FIG. 3, on the semiconductor chips CP1 to CP4, the pad electrodes PD1 to PD4 are formed as the address terminals A0 to A7, the read/write terminals R/W, the chip select terminals CS, and the data terminals D1 to D4 shown in FIG. 2. In stacking and mounting the four semiconductor chips CP1 to CP4 on the semiconductor package PK2, the semiconductor chips CP1 to CP4 can be stacked in a shifted manner so that the pad electrodes PD1 to PD4 are exposed. Further, the pad electrodes PD1 to PD4 of, for example, the address terminals A0 shown in FIG. 2 are commonly connected to the external terminal T1 via the bonding wires BW. In this way, the single external terminal T1 can be shared by the address terminals A0 of the four semiconductor chips CP1 to CP4.

Figure 4:
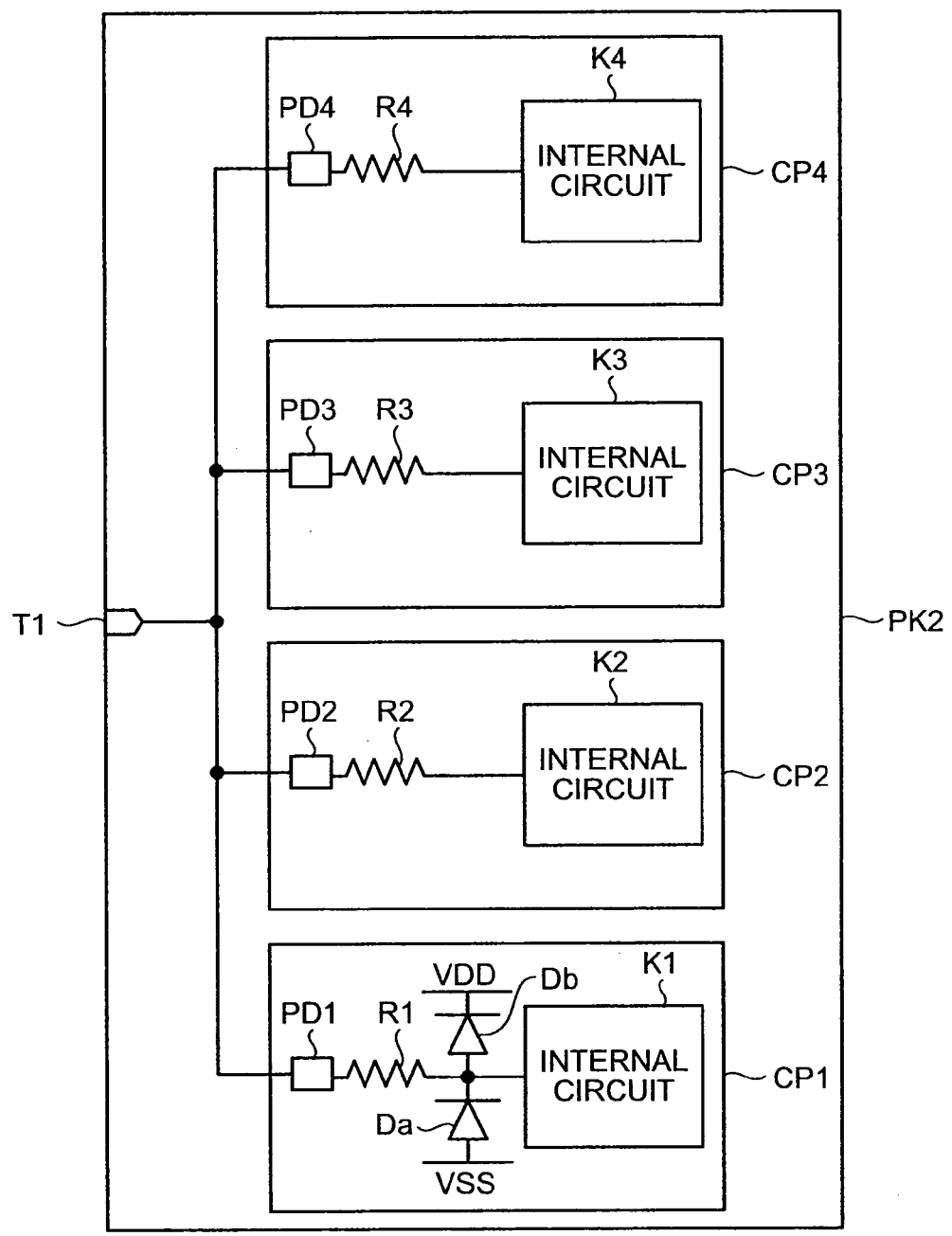
FIG. 4 is a schematic diagram of an electrostatic protection circuit applicable to the semiconductor device shown in FIG. 2.

FIG. 4 is a schematic diagram of an electrostatic protection circuit applicable to the semiconductor device shown in FIG. 2.

In FIG. 4, the semiconductor chips CP1 to CP4 include the internal circuits K1 to K4, respectively. The pad electrodes PD1 to PD4 are respectively connected to the internal circuits K1 to K4 via resistors R1 to R4, and are also commonly connected to the external terminal T1. A junction between the resistor R1 and the internal circuit K1 is connected to a low voltage potential VSS via a diode Da, and is also connected to a high voltage potential VDD via a diode Db. The diodes Da and Db can constitute an electrostatic protection circuit.

When a surge voltage is applied to the external terminal T1, the diode Da or the diode Db breaks down, so that the potential of the pad electrode PD1 can be maintained in a range between the low voltage potential VSS and the high voltage potential VDD. Accordingly, the internal circuit K1 is protected from electrostatic breakdown. Further, because the pad electrodes PD2 to PD4 are connected to the pad electrode PD1, the potential of the pad electrodes PD2 to PD4 can be maintained at the same potential as the pad electrode PD1. Accordingly, the internal circuits K2 to K4 are protected from electrostatic breakdown even when no electrostatic protection circuit is mounted on the semiconductor chips CP2 to CP4. Although the pad electrodes PD1 to PD4 are commonly connected to the external terminal T1, only the capacitance of the diodes Da and Db of one semiconductor chip CP1 is added. This prevents an increase in capacitance to be added to the external terminal T1.

The foregoing describes a method of mounting an electrostatic protection circuit only on the semiconductor chip CP1 among the four semiconductor chips CP1 to CP4. This method requires to prepare the semiconductor chip CP1 incorporating an electrostatic protection circuit, and the semiconductor chips CP2 to CP4 incorporating no electrostatic protection circuit. This may cause an increase in manufacturing cost and complex management process of the semiconductor chips CP1 to CP4.

For this reason, by preparing semiconductor chips incorporating an electrostatic protection circuit and by changing external wiring, some semiconductor chips may have an electrostatic protection circuit connected to an external terminal of a semiconductor package, and the other semiconductor chips may have an electrostatic protection circuit not connected to the external terminal of the semiconductor package. The following embodiment describes a method using bonding wires for the external wiring.

Second Embodiment

Figure 5:
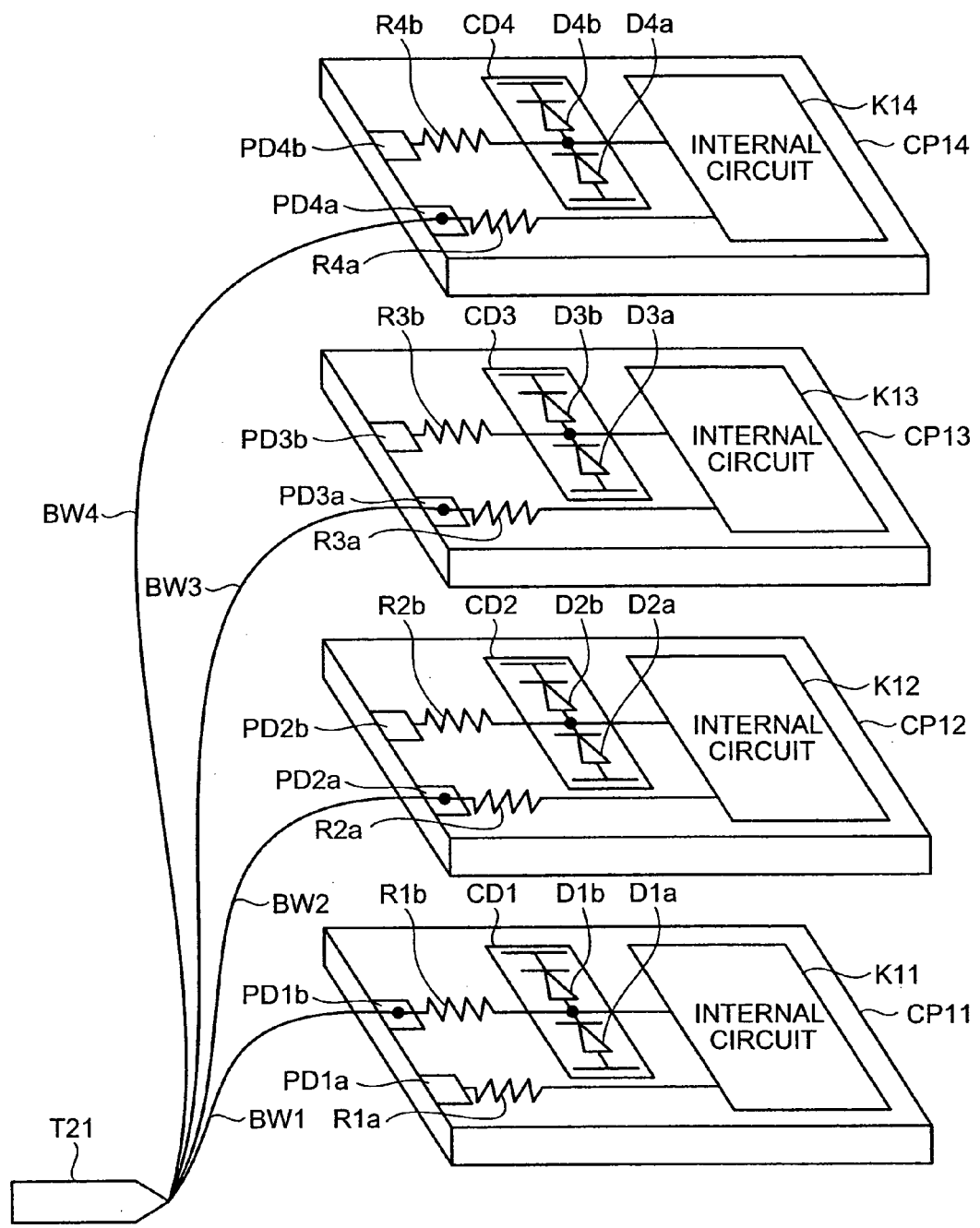
FIG. 5 is a schematic perspective view of an electrostatic protection circuit applicable to a semiconductor device according to a second embodiment of the present invention.

FIG. 5 is a schematic perspective view of an electrostatic protection circuit applicable to a semiconductor device according to a second embodiment of the present invention.

In FIG. 5, semiconductor chips CP11 to CP14 include internal circuits K11 to K14, respectively. Further, the semiconductor chips CP11 to CP14 include pad electrodes PD1a to PD4a, and PD1b to PD4b, respectively. The pad electrodes PD1a to PD4a are connected to the internal circuits K11 to K14 via resistors R1a to R4a, respectively, and the pad electrodes PD1b to PD4b are connected to the internal circuits K11 to K14 via resistors R1b to R4b and electrostatic protection circuits CD1 to CD4, respectively. The electrostatic protection circuits CD1 to CD4 include diodes D1a to D4a, and D1b to D4b, respectively. The semiconductor chips CP11 to CP14 are commonly mounted on a single semiconductor package, and the pad electrodes PD1b and PD2a to PD4a are commonly connected to an external terminal T21 of the semiconductor package via bonding wires BW1 to BW4.

This allows the electrostatic protection circuit CD1 of the semiconductor chip CP11 to be shared by the semiconductor chips CP11 to CP14. Accordingly, the electrostatic protection function of the semiconductor chips CP11 to CP14 can be secured by using only the electrostatic protection circuit CD1 of the semiconductor chip CP11. Further, the pad electrodes PD1b and PD2a to PD4a respectively connected to the internal circuits K11 to K14 can be commonly connected to the external terminal T21. This prevents that the capacitance of the electrostatic protection circuits CD2 to CD4 is added to the external terminal T21, without changing the structure of the semiconductor chips CP11 to CP14. It also becomes possible to prevent an increase in manufacturing cost and complex management process of the semiconductor chips CP11 to CP14, while preventing a reduction in operating frequency of the internal circuits K11 to K14 and an increase in electric power consumption.

The following describes specific structures of an electrostatic protection circuit separately, in which pad electrodes of the semiconductor chip CP11 are used as input terminals, as output terminals, or as input-output terminals.

Third Embodiment

Figure 6:
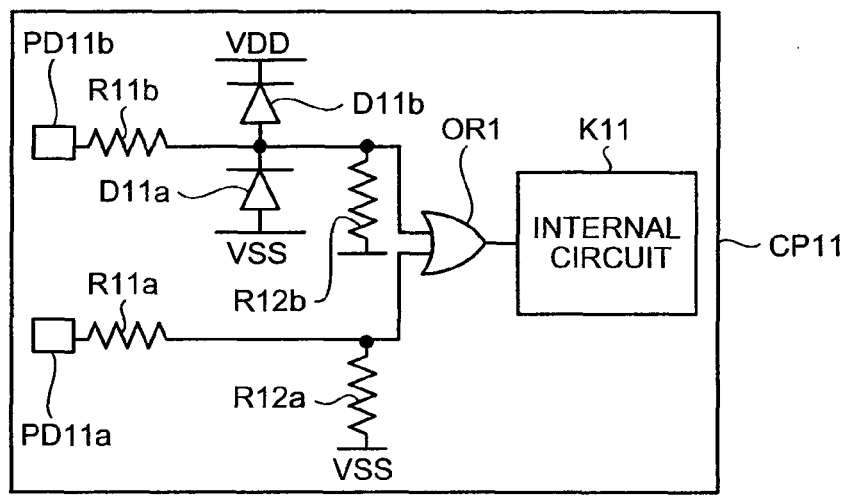
FIG. 6 is a schematic perspective view of an electrostatic protection circuit applicable to a semiconductor device according to a third embodiment of the present invention.

FIG. 6 is a schematic perspective view of an electrostatic protection circuit applicable to a semiconductor device according to a third embodiment of the present invention.

In FIG. 6, the semiconductor chip CP11 includes pad electrodes PD11a and PD11b as input terminals that receive an input to the internal circuit K11. The pad electrode PD11a is connected to a first input terminal of an OR circuit OR1 via a resistor R11a, and the first input terminal of the OR circuit OR1 is connected to the low voltage potential VSS via a resistor R12a.

The pad electrode PD11b is connected to a second input terminal of the OR circuit OR1 via a resistor R11b, and the second input terminal of the OR circuit OR1 is connected to the low voltage potential VSS via a resistor R12b. An output terminal of the OR circuit OR1 is connected to the internal circuit K11.

A junction between the resistor R11b and the second input terminal of the OR circuit OR1 is connected to the low voltage potential VSS via a diode D11a, and is also connected to the high voltage potential VDD via a diode D11b.

To enable the electrostatic protection function of the input terminals of the semiconductor chip CP11, the pad electrode PD11b can be connected to an external terminal of the semiconductor package on which the semiconductor chip CP11 is mounted. To disable the electrostatic protection function of the input terminals of the semiconductor chip CP11, the pad electrode PD11a can be connected to the external terminal of the semiconductor package on which the semiconductor chip CP11 is mounted. As a method of connecting the pad electrodes PD11a and PD11b to the external terminal of the semiconductor package, wire bonding may be used, for example.

When the pad electrode PD11b is connected to the external terminal of the semiconductor package, the pad electrode PD11a is open. Because the first input terminal of the OR circuit OR1 is connected to the low voltage potential VSS via the resistor R12a, a logical value '0' is input to the first input terminal of the OR circuit OR1. Thus, when an input signal is applied to the pad electrode PD11b, the input signal can be transferred to the internal circuit K11 via the OR circuit OR1.

When the pad electrode PD11a is connected to the external terminal of the semiconductor package, the pad electrode PD11b is open. Because the second input terminal of the OR circuit OR1 is connected to the low voltage potential VSS via the resistor R12b, a logical value '0' is input to the second input terminal of the OR circuit OR1. Thus, when an input signal is applied to the pad electrode PD11a, the input signal can be transferred to the internal circuit K11 via the OR circuit OR1.

By selecting either the pad electrode PD11a or the pad electrode PD11b, it is possible to enable or disable the electrostatic protection function of the input terminals of the semiconductor chip CP11. Further, even by selecting any of the pad electrodes PD11a and PD11b, the input signal can be transferred to the internal circuit K11 via the OR circuit OR1.

The circuit shown in FIG. 6 may be used, for example, for the address terminals A0 to A7 and the read/write terminal R/W shown in FIG. 2.

Fourth Embodiment

Figure 7:
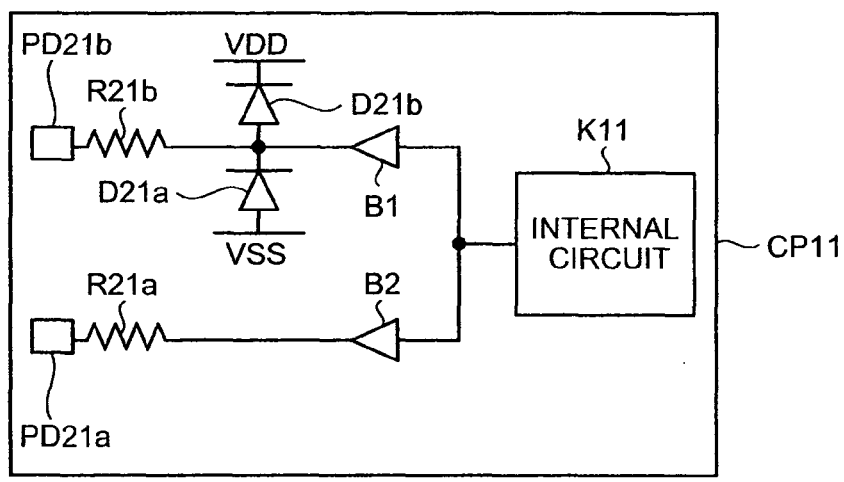
FIG. 7 is a schematic perspective view of an electrostatic protection circuit applicable to a semiconductor device according to a fourth embodiment of the present invention.

FIG. 7 is a schematic perspective view of an electrostatic protection circuit applicable to a semiconductor device according to a fourth embodiment of the present invention.

In FIG. 7, the semiconductor chip CP11 includes pad electrodes PD21a and PD21b as output terminals that receive an output from the internal circuit K11. The internal circuit K11 is connected to the pad electrode PD21a via a buffer B2 and a resistor R21a in order, and is also connected to the pad electrode PD21b via a buffer B1 and a resistor R21b in order.

A junction between the resistor R21b and an output terminal of the buffer B1 is connected to the low voltage potential VSS via a diode D21a, and is also connected to the high voltage potential VDD via a diode D21b.

To enable the electrostatic protection function of the output terminals of the semiconductor chip CP11, the pad electrode PD21b can be connected to the external terminal of the semiconductor package on which the semiconductor chip CP11 is mounted. To disable the electrostatic protection function of the output terminals of the semiconductor chip CP11, the pad electrode PD21a can be connected to the external terminal of the semiconductor package on which the semiconductor chip CP11 is mounted. As a method of connecting the pad electrodes PD21a and PD21b to the external terminal of the semiconductor package, wire bonding may be used, for example.

The capacitance of the pad electrode PD21a can be separated from the capacitances of the diodes D21a and D21b by providing the buffers B1 and B2. This prevents that the capacitances of the diodes D21a and D21b are added to the pad electrode PD21a even when the pad electrodes PD21a and PD21b are commonly connected to the internal circuit K11. By selecting either the pad electrode PD21a or the pad electrode PD21b, it is possible to enable or disable the electrostatic protection function of the output terminals of the semiconductor chip CP11. Further, by selecting the pad electrode PD21a, it is possible to prevent that the capacitance of the electrostatic protection circuit is added to the external terminal via the output terminals of the semiconductor chip CP11.

Fifth Embodiment

Figure 8:
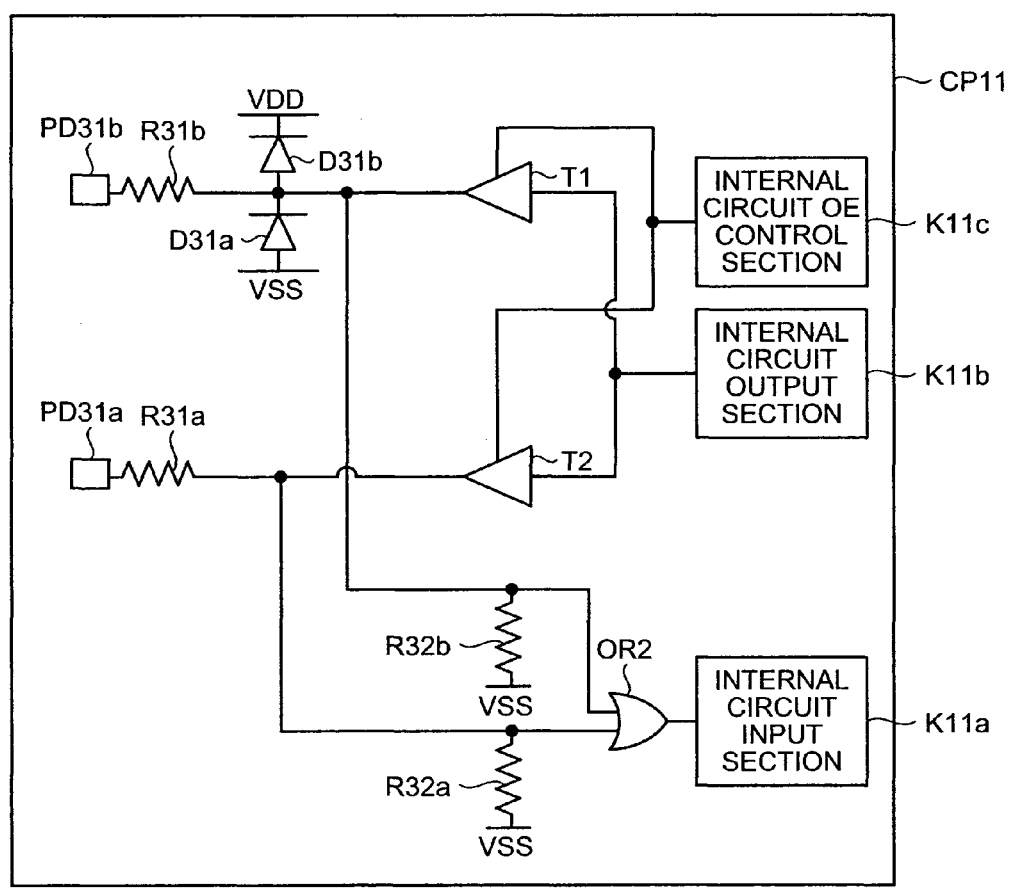
FIG. 8 is a schematic perspective view of an electrostatic protection circuit applicable to a semiconductor device according to a fifth embodiment of the present invention.

FIG. 8 is a schematic perspective view of an electrostatic protection circuit applicable to a semiconductor device according to a fifth embodiment of the present invention.

In FIG. 8, the semiconductor chip CP11 includes, as the internal circuit K11, an internal circuit input section K11a, an internal circuit output section K11b, and an internal circuit OE control section K11c. Further, the semiconductor chip CP11 includes pad electrodes PD31a and PD31b as input-output terminals that receive an input to the internal circuit input section K11a and an output from the internal circuit output section K11b.

The pad electrode PD31a is connected to a first input terminal of an OR circuit OR2 via a resistor R31a, and the first input terminal of the OR circuit OR2 is connected to the low voltage potential VSS via a resistor R32a.

The pad electrode PD31b is connected to a second input terminal of the OR circuit OR2 via a resistor R31b, and the second input terminal of the OR circuit OR2 is connected to the low voltage potential VSS via a resistor R32b. An output terminal of the OR circuit OR2 is connected to the internal circuit input section K11a.

The internal circuit output section K11b is connected to the pad electrode PD31a via a tri-state buffer T2 and the resistor R31a in order, and is also connected to the pad electrode PD31b via a tri-state buffer T1 and the resistor R31b in order.

A junction between the resistor R31b and an output terminal of the tri-state buffer T1 is connected to the low voltage potential VSS via a diode D31a, and is also connected to the high voltage potential VDD via a diode D31b.

The internal circuit OE control section K11c is connected to a switching control terminal of the tri-state buffer T1, and is also connected to a switching control terminal of the tri-state buffer T2.

To enable the electrostatic protection function of the input-output terminals of the semiconductor chip CP11, the pad electrode PD31b is connected to the external terminal of the semiconductor package on which the semiconductor chip CP11 is mounted. To disable the electrostatic protection function of the input-output terminals of the semiconductor chip CP11, the pad electrode PD31a is connected to the external terminal of the semiconductor package on which the semiconductor chip CP11 is mounted. As a method of connecting the pad electrodes PD31a and PD31b to the external terminal of the semiconductor package, wire bonding may be used, for example.

When the pad electrode PD31b is connected to the external terminal of the semiconductor package, the pad electrode PD31a is open. Because the first input terminal of the OR circuit OR2 is connected to the low voltage potential VSS via the resistor R32a, a logical value '0' is input to the first input terminal of the OR circuit OR2. Thus, when an input signal is applied to the pad electrode PD31b, the input signal can be transferred to the internal circuit input section K11a via the OR circuit OR2.

According to an output enable signal from the internal circuit OE control section K11c, an output signal from the internal circuit output section K11b is transferred to the pad electrode PD31b via the tri-state buffer T1, and is also transferred to the pad electrode PD31a via the tri-state buffer T2. This operation does not affect the behavior of the circuit because the pad electrode PD31a is open.

When the pad electrode PD31a is connected to the external terminal of the semiconductor package, the pad electrode PD31b is open. Because the second input terminal of the OR circuit OR2 is connected to the low voltage potential VSS via the resistor R32b, a logical value '0' is input to the second input terminal of the OR circuit OR2. Thus, when an input signal is applied to the pad electrode PD31a, the input signal can be transferred to the internal circuit input section K11a via the OR circuit OR2.

According to an output enable signal from the internal circuit OE control section K11c, an output signal from the internal circuit output section K11b is transferred to the pad electrode PD31a via the tri-state buffer T2, and is also transferred to the pad electrode PD31b via the tri-state buffer T1.

This operation does not affect the behavior of the circuit because the pad electrode PD31b is open.

The foregoing describes a method of providing the tri-state buffers T1 and T2 to connect the internal circuit output section K11b to the pad electrodes PD31a and PD31b. Circuits other than the tri-state buffers T1 and T2 may be used, as long as a plurality of outputs can be connected to one line as in an open collector.

The circuit shown in FIG. 8 may be used, for example, for the data terminals D1 to D4 shown in FIG. 2.

Sixth Embodiment

Figure 9:
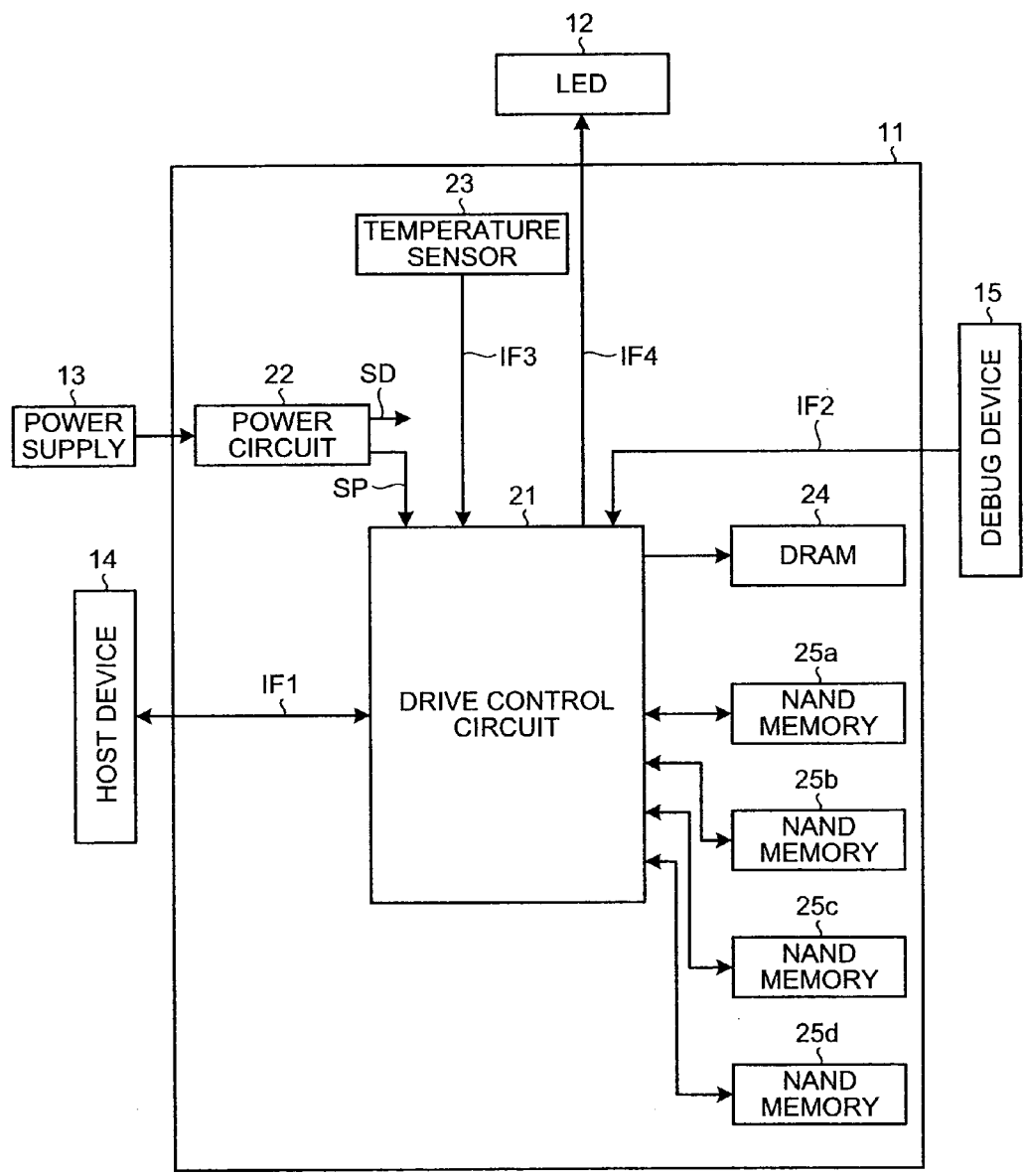
FIG. 9 is a schematic block diagram of a solid state drive to which a semiconductor device according to a sixth embodiment of the present invention is applied.

FIG. 9 is a schematic block diagram of a solid state drive to which a semiconductor device according to a sixth embodiment of the present invention is applied.

In FIG. 9, a solid state drive 11 includes: a plurality of NAND memories 25a to 25d for data storage; a DRAM 24 for data transfer or as a work area; a temperature sensor 23 that detects an internal temperature of the solid state drive 11; a light emitting diode 12 for status indication; a drive control circuit 21 that controls these components; and a power circuit 22 that supplies power to the components. As the NAND memories 25a to 25d, the semiconductor package PK2 can be used on which the semiconductor chips CP1 to CP4 are mounted as shown in FIG. 2.

The drive control circuit 21 is connected to the NAND memories 25a to 25d and the DRAM 24. The drive control circuit 21 is connected to a host device 14 such as a personal computer via an advanced technology attachment (ATA) interface IF1, to a debug device 15 via a recommended standard (RS) 232C interface IF2, and to the temperature sensor 23 via an inter-integrated circuit ($I^2C$) interface IF3. Further, the drive control circuit 21 is connected to the light emitting diode 12 via a parallel interface IF4.

The power circuit 22 generates a plurality of internal power signals SD from power supplied from an external power supply 13, and provides them to the components. The power circuit 22 also generates a power-on/off-reset signal SP by detecting the rise and the falling of the external power supply 13, and provides it to the drive control circuit 21.

When writing to the NAND memories 25a to 25d, the drive control circuit 21 temporarily stores in the DRAM 24 the write data supplied from the host device 14. The drive control circuit 21 then transfers the write data stored in the DRAM 24 to the NAND memories 25a to 25d, and writes the write data to the NAND memories 25a to 25d.

When reading out from the NAND memories 25a to 25d, the drive control circuit 21 reads out read data from the NAND memories 25a to 25d, and temporarily stores it in the DRAM 24. The drive control circuit 21 then transfers the read data stored in the DRAM 24 to the host device 14.

Figure 10:
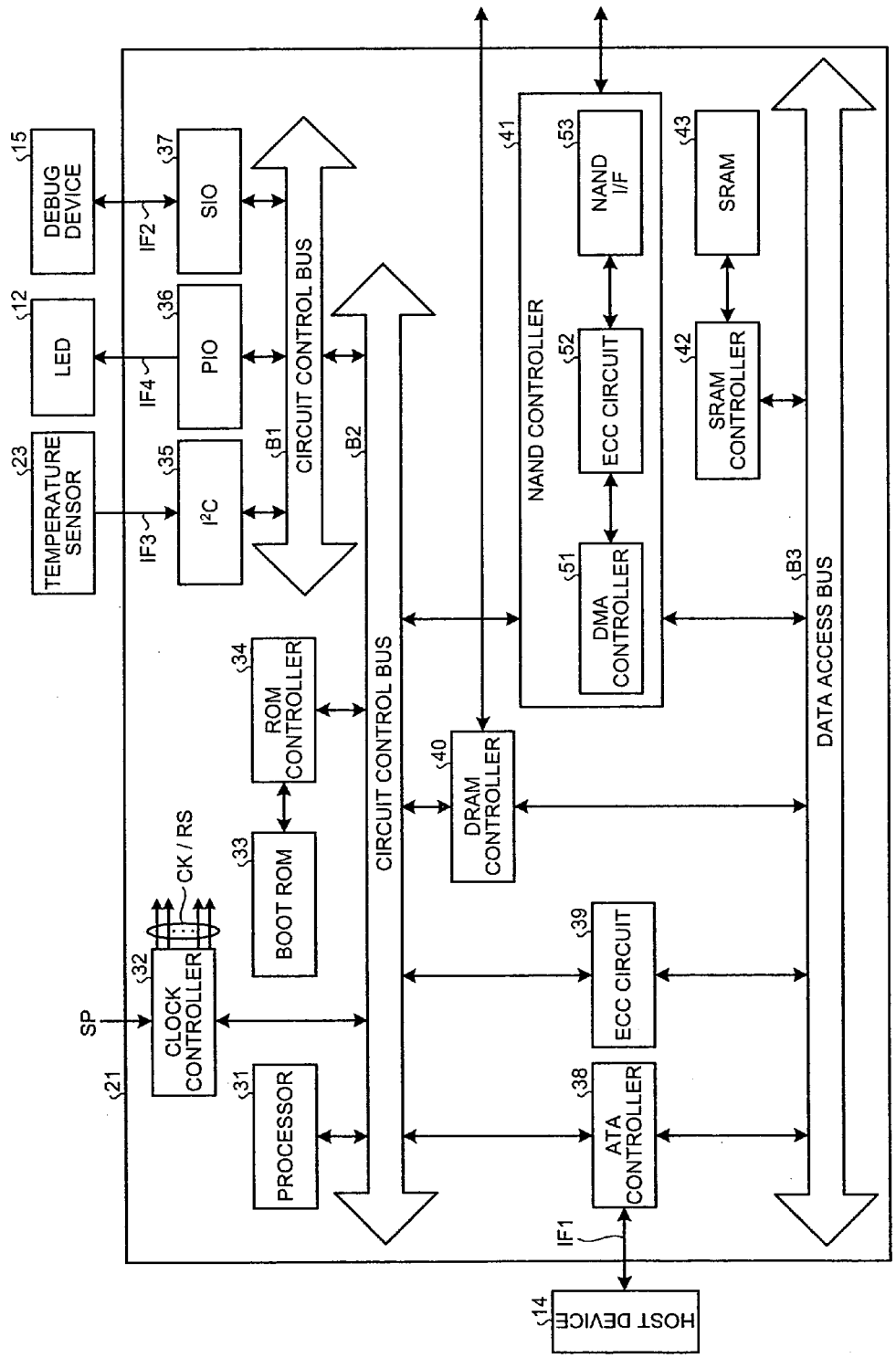
FIG. 10 is a schematic block diagram of a drive control circuit shown in FIG. 9.

FIG. 10 is a schematic block diagram of the drive control circuit shown in FIG. 9.

In FIG. 10, the drive control circuit 21 includes circuit control buses B1 and B2, and a data access bus B3. The circuit control bus B2 is connected to a processor 31 that controls the drive control circuit 21. Further, the circuit control bus B1 is connected via a ROM controller 34 to a boot ROM 33 that stores therein a boot program for booting management programs (FW).

The circuit control bus B1 is connected to a clock controller 32 that provides a reset signal CK and a clock signal RS to the components in response to the power-on/off-reset signal SP from the power circuit 22.

The circuit control bus B1 is connected to the circuit control bus B2, so that the circuit control bus B1 is connected to an $I^2C$ circuit 35 that receives data from the temperature sensor 23, to a parallel IO circuit 36 that provides a status indication signal to the light emitting diode 12, and to a serial IO circuit 37 that controls the RS232C interface IF2.

Both the data access bus B3 and the circuit control bus B2 are connected to an ATA interface controller 38 that controls the ATA interface IF1, an error detection and correction (ECC) circuit 39 that corrects an error in data read from and written to the NAND memories 25a to 25d, a NAND controller 41 that controls deleting, writing, and reading of the NAND memories 25a to 25d, and a DRAM controller 40 that controls deleting, writing, and reading of the DRAM 24.

One side of the ATA interface controller 38 is used for transmitting and receiving data to and from the host device 14 via the ATA interface IF1.

The data access bus B3 is connected via an SRAM controller 42 to an SRAM 43 used as a data work area.

The NAND controller 41 includes a NAND interface 53 serving as an interface with the four NAND memories 25a to 25d, an ECC circuit section 52 that corrects an error in data read from and written to the NAND memories 25a to 25d, and a direct memory access (DMA) controller 51 that controls DMA transfer between the NAND memories 25a to 25d and the DRAM 24.

Upon receiving the power-on/off-reset signal SP supplied from the power circuit 22, the clock controller 32 provides the reset signal CK and the clock signal RS to the components. The ROM controller 34 reads out the boot program from the boot ROM 33, and transfers it to the processor 31. The processor 31 loads the management programs from the NAND memories 25a to 25d to the SRAM 43. The NAND controller 41 can access the NAND memories 25a to 25d according to a management program loaded to the SRAM 43, and control deleting, writing, and reading of the NAND memories 25a to 25d.

Figure 11:
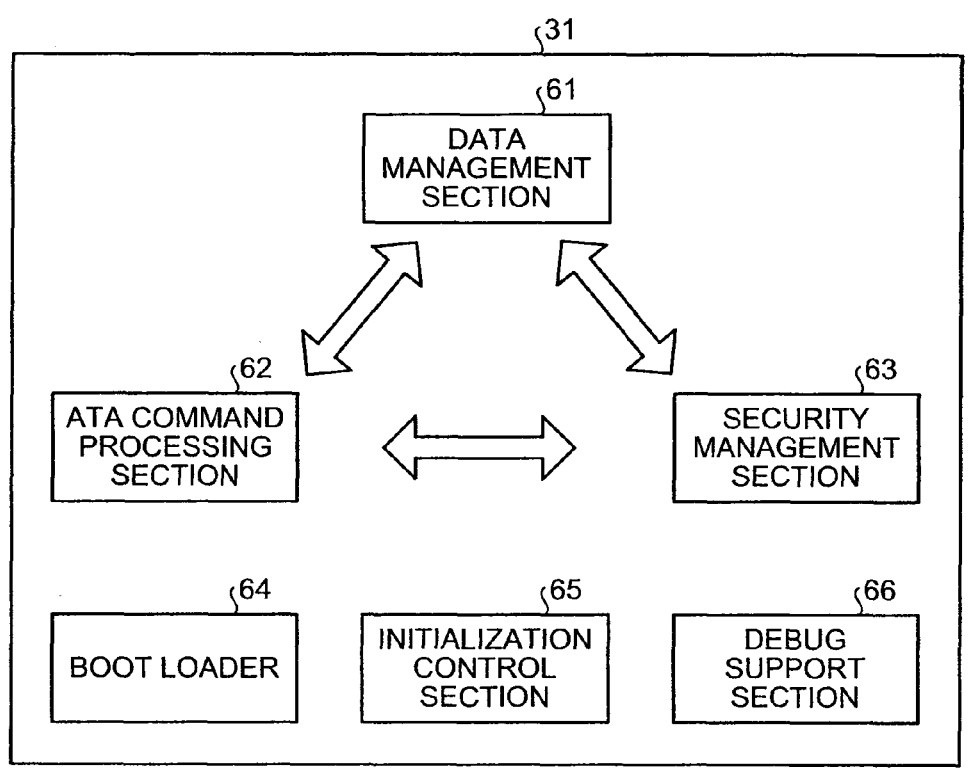
FIG. 11 is a schematic block diagram of a processor shown in FIG. 10.

FIG. 11 is a schematic block diagram of the processor shown in FIG. 10.

In FIG. 11, the processor 31 includes a data management section 61, an ATA command processing section 62, a security management section 63, a boot loader 64, an initialization control section 65, and a debug support section 66.

The data management section 61 controls data transfer between the NAND memories 25a to 25d and the DRAM 24, and various functions of the NAND memories 25a to 25d, via the NAND controller 41, the ECC circuit 39, and the $I^2C$ circuit 35.

The ATA command processing section 62 performs data transfer in cooperation with the data management section 61, via the ATA interface controller 38 and the DRAM controller 40.

The security management section 63 manages various kinds of security information, in cooperation with the data management section 61 and the ATA command processing section 62.

The boot loader 64 loads the management programs (FW) from the NAND memories 25a to 25d to the SRAM 43 at power-on time.

The initialization control section 65 performs initialization of the controllers/circuits on the drive control circuit 21.

The debug support section 66 processes the debug data externally supplied via the RS232C interface IF2.

The semiconductor package PK2 on which the semiconductor chips CP1 to CP4 are mounted as shown in FIG. 2 is used for the NAND memories 25a to 25d. This makes it possible to increase the data capacitance of the NAND memories 25a to 25d, while preventing the NAND memories 25a to 25d from electrostatic breakdown and reducing the load capacitance of the NAND controller 41.

As described, according to the present invention, it is possible to reduce the capacitance to be added to the external terminals, without degrading the electrostatic protection function of the semiconductor chips sharing the external terminals.

The invention claimed is:

1. A semiconductor device comprising a semiconductor package: the semiconductor package comprising:
   a first chip comprising a first pad and a first circuit connected to the first pad via a first resistor without intervening an electrostatic protection circuit;
   a second chip comprising a second pad and a second circuit electrically connected to the second pad via a second resistor and a connecting portion of an electrostatic protection circuit, the first chip and the second chip being overlapped with each other;
   an external terminal electrically connected to the first pad and the second pad, wherein
   the first pad, the second pad and the external terminal are aligned along a first direction, and the second pad and the connecting portion are aligned along a second direction which crosses the first direction.

2. The semiconductor device according to claim 1, wherein the electrostatic protection circuit is a diode formed on the second chip.

3. The semiconductor device according to claim 2, wherein the first circuit and the second circuit are NAND flash memories.

4. The semiconductor device according to claim 3, wherein the first chip and the second chip mounted on the semiconductor package.

5. The semiconductor device according to claim 4, wherein the semiconductor package mounting the first chip and the second chip constitutes a NAND memory.

6. The semiconductor device according to claim 5, wherein the first chip and the second chip include address terminals, data terminals, read/write terminals, and chip select terminals,
   the address terminals, the data terminals, and the read/write terminals are respectively connected to common external terminals of the semiconductor package via bonding wires, and
   each of the chip select terminals is individually connected to an external terminal of the semiconductor package via a bonding wire.

7. The semiconductor device according to claim 6, further comprising a controller that controls to drive the NAND memory, wherein
   the NAND memory is a plurality of NAND memories connected in parallel.

8. The semiconductor device according to claim 7, wherein the controller includes:
   a boot ROM that stores therein a boot program;
   an SRAM that stores therein a management program stored in the NAND memory;
   a processor that loads the management program from the NAND memory to the SRAM according to the boot program; and
   a NAND controller that controls deleting, writing, and reading of data, by accessing the NAND memory according to the management program loaded to the SRAM.

9. A semiconductor device comprising:
   first and second semiconductor chips including internal circuits respectively formed thereon;
   electrostatic protection circuits that are respectively formed on the first and the second semiconductor chips, and that protect the internal circuits from static electricity;
   first pad electrodes respectively formed on the first and the second semiconductor chips, and electrically connected to the internal circuits via each first resistor and each connecting portion of the electrostatic protection circuits;
   second pad electrodes respectively formed on the first and the second semiconductor chips, and connected to the internal circuits via each second resistor, not via the electrostatic protection circuits; and
   a semiconductor package mounting the first and the second semiconductor chips, and having external terminals shared by the first pad electrode of the first semiconductor chip and the second pad electrode of the second semiconductor chip, wherein;
   a signal is transferred from the first pad electrode to the internal circuit via the electrostatic protection circuit in the first semiconductor chip to protect both the first and second semiconductor chips, and a signal is transferred from the second pad electrode to the internal circuit not via the electrostatic protection circuit in the second semiconductor chip, wherein
   the first pad, the second pad and the external terminal are aligned along a first direction, and the second pad and the connecting portion are aligned along a second direction which crosses the first direction.

10. The semiconductor device according to claim 9, wherein the first pad electrode of the first semiconductor chip, the second pad electrode of the second semiconductor chip, and the external terminals of the semiconductor package are connected to one another via bonding wires.

11. The semiconductor device according to claim 10, wherein when the external terminals are input-output terminals, the first and the second pad electrodes are shared by input sections and output sections of the internal circuits, and the output sections of the internal circuits of the first and the second semiconductor chips are connected to the first and the second pad electrodes respectively via first and second tri-state buffers that are switchably controlled according to an output enable signal.

12. The semiconductor device according to claim 9, wherein the electrostatic protection circuits formed on the first and the second semiconductor chips are diodes.

13. The semiconductor device according to claim 12, wherein the internal circuits are NAND flash memories.

14. The semiconductor device according to claim 13, wherein the first and the second semiconductor chips are stacked and mounted on the semiconductor package.

15. The semiconductor device according to claim 14, wherein the semiconductor package mounting the first and the second semiconductor chips constitutes a NAND memory.

16. The semiconductor device according to claim 14, wherein
   the first and the second semiconductor chips include address terminals, data terminals, read/write terminals, and chip select terminals,
   the address terminals, the data terminals, and the read/write terminals are respectively connected to common external terminals of the semiconductor package via bonding wires, and
   each of the chip select terminals is individually connected to an external terminal of the semiconductor package via a bonding wire.

17. The semiconductor device according to claim 16, further comprising a controller that controls to drive the NAND memory, wherein
the NAND memory is a plurality of NAND memories connected in parallel.

18. The semiconductor device according to claim 17, wherein the controller includes:
a boot ROM that stores therein a boot program;
an SRAM that stores therein a management program stored in the NAND memory;
a processor that loads the management program from the NAND memory to the SRAM according to the boot program; and
a NAND controller that controls deleting, writing, and reading of data, by accessing the NAND memory according to the management program loaded to the SRAM.

* * * * *